(12) United States Patent
Johnson et al.

(10) Patent No.: US 6,292,361 B1
(45) Date of Patent: Sep. 18, 2001

(54) APPARATUS AND METHOD FOR MOUNTING AND COOLING A SYSTEM COMPONENT ASSEMBLY IN A COMPUTER

(75) Inventors: Robert W. Johnson, Pflugerville; Richard L. Eddings, II, Austin; James D. Curlee, Round Rock, all of TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/468,494

(22) Filed: Dec. 20, 1999

(51) Int. Cl.[7] ........................................ G06F 1/20
(52) U.S. Cl. .................. 361/687; 361/695; 361/796; 361/802; 361/816; 165/104.33; 165/185; 165/121; 312/223.1
(58) Field of Search .................... 361/683, 685, 361/687, 692, 695–699, 678, 717–719, 720, 756, 795; 165/80.3, 104.31, 104.32, 104.33, 122, 40, 121; 454/184; 62/259.2, 263; 257/713–727; 364/708.1; 312/223.1; 211/41; 174/16.1, 16.3; 360/97.01, 97.02, 97.03, 98.01, 137; 369/75.1, 80

(56) References Cited

U.S. PATENT DOCUMENTS

| | | |
|---|---|---|
| 5,338,214 | 8/1994 | Steffes et al. . |
| 5,793,611 | 8/1998 | Nakazato et al. . |
| 5,796,580 * | 8/1998 | Komatsu et al. ................ 361/687 |
| 5,828,549 | 10/1998 | Gandre et al. . |
| 5,852,547 | 12/1998 | Kitlas et al. . |
| 5,936,836 * | 8/1999 | Scholder ............................ 361/695 |
| 6,094,346 * | 7/2000 | Schweers et al. ................ 361/695 |
| 6,128,187 * | 10/2000 | Mimilitch et al. ............... 361/690 |
| 6,130,819 * | 10/2000 | Lofland et al. .................. 361/695 |
| 6,130,820 * | 10/2000 | Konstad et al. ................. 361/695 |
| 6,185,065 * | 2/2001 | Hasegawa et al. ............. 360/97.02 |

* cited by examiner

Primary Examiner—Leo P. Picard
Assistant Examiner—Michael Datskovsky
(74) Attorney, Agent, or Firm—Haynes and Boone, L.L.P.

(57) ABSTRACT

An apparatus including a base substrate and a plurality of spaced apart end brackets attached to the base substrate. A plurality of spaced apart side panel assemblies are removably mounted between a mounting portion of each end bracket. A first edge of each side panel assembly positioned adjacent to the base substrate. A shroud is pivotally attached to each one of the side panel assemblies adjacent to a second edge of the respective side panel assembly. Each shroud is movable about a pivot axis between an open position and a closed position with respect to the respective side panel assembly. A shroud engaging portion is attached to each end bracket adjacent to each shroud. A engagement member of each shroud engages a corresponding shroud engaging portion when the respective shroud is moved from the open position to the closed position for moving the respective printed circuit substrate from an inserted position to a seated position with respect to the base substrate. Fewer components are required to construct the apparatus relative to previous apparatuses, reducing the cost and assembly. Furthermore, the shrouds function as a cam device for seating the system component assembly in the chassis.

20 Claims, 10 Drawing Sheets

APPARATUS AND METHOD FOR MOUNTING AND COOLING A SYSTEM COMPONENT ASSEMBLY IN A COMPUTER

BACKGROUND

The disclosures herein relate generally to computers and more particularly to an apparatus for mounting and cooling a system component assembly in a computer.

The thermal requirements of high performance systems have increased significantly over the past few years. With the increasing thermal requirements, the customer's requirements for acoustics and serviceability have also increased. The increased airflow requirements for faster components can be solved two ways, optimizing the airflow through the enclosure or adding more fans to increase airflow throughout the entire enclosure. Adding more fans contradicts the acoustic goals required by the customer.

Serviceability of major components in manufacturing reduces the throughput of new products down the manufacturing assembly line. Ease of service of these items is critical to maintaining the throughput in manufacturing. Eliminating screws and other hardware is key to reducing manufacturing and service times. The design challenge is how to reliably retain critical components and still make the system components in the computer easy and cost effective to manufacture, service and install.

A typical solution for optimizing airflow through the systems is the use of a shroud. The shroud is typically a plastic piece that is added into the enclosure once the system is built. The shroud must then be removed before the customer can gain access to the critical components. The addition of the shroud requires extra time for manufacturing and service. Individual latches or screws are typically used to retain critical components such as memory. These are separate parts, which increase inventory and cost.

Computers include system components that such as memory modules, microprocessors and video controllers that generate a considerable amount of heat. Advances in the performance of many system components demand more effective thermal solutions. Furthermore, these thermal solutions must be offered without sacrificing mechanical support, cost, serviceability, or acoustic performance.

To maintain heat generating components at a suitable temperature level, one or more cooling fans are traditionally mounted in a computer to provide airflow for effectively cooling the heat sensitive components. This requires fasteners or additional components, increasing cost, assembly time, and acoustic noise. In some applications, a separate shroud or duct is sometimes needed to ensure that airflow is properly directed with respect to the heat generating components. The fan or fans are usually mounted to an internal bracket or an external wall of the system chassis.

U.S. Pat. No. 5,852,547 discloses a shroud attachment for positioning a central processing unit (CPU) module relative to a cooling fan on a motherboard in a computer. The CPU module includes an enclosure housing for directing air past the CPU. The system components comprising the CPU are attached to the enclosure such that the system components and the enclosure housing must be removed from the mother board as a unit.

U.S. Pat. No. 5,338,214 discloses an expansion card/riser card module which includes a housing within which a riser card and a plurality of associated expansion cards are removably supported and electrically coupled to each other. The housing includes a fan for directing a stream of air over the riser and expansion cards. The construction disclosed requires that the housing and the attached cards be attached to the motherboard as a unit.

U.S. Pat. No. 5,793,611 discloses an apparatus for cooling heat generating components in a computer system. The apparatus includes an enclosure having a plurality of walls defining a cavity. A printed circuit board is mounted within the cavity and heat generating components are mounted to the printed circuit board. A first fan is provided for inducing air to flow into the enclosure, and a second fan is provided for expelling air from the enclosure. A baffle is mounted in the enclosure to direct the flow of air over the heat generating components.

RAMBUS In-Line Memory Modules, also referred to as RIMM modules, illustrate one example of high performance system components that operate at a relatively high operating speed. The performance of RIMM modules is attained through a high-speed bus enabling clock speeds in excess of 400 MHz. Through the use of one or more riser cards, RIMM modules may be configured to provide memory in excess of 8 GigaBytes. A riser card is connected to a memory connector on a motherboard of the computer and a plurality of RIMM modules are connected to the riser card through corresponding RIMM connectors that are mounted on the riser card.

When designing a computer system using RIMM modules, as well as other heat generating system components, it must be taken into consideration that the performance and operating life of these types of system components are adversely affected by excessive temperatures. The magnitude of memory attainable with RIMM modules and the frequency at which RIMM modules operate can result in the generation of tremendous quantities of heat. As a result, it is necessary to use a cooling apparatus to control the operating temperature of these types of heat generating system components. However, previous apparatuses for cooling system components include shortcomings resulting in the apparatus being costly to manufacture and install, providing limited versatility, adversely affecting acoustical performance and providing limited cooling capacity.

Accordingly, there is a need for an apparatus for mounting and cooling heat generating system components that provides enhanced cooling capability, that can be cost effectively manufactured and installed, that can be used with a variety of system component configurations and that limits induced acoustical noise.

SUMMARY

One embodiment, accordingly, provides an apparatus that includes shrouds pivotally mounted to corresponding side panel assemblies for defining a portion of an air duct when in a closed position and for moving each side panel assembly to a seated position when the corresponding shroud is moved to the closed position. To this end, an electronic device enclosure includes a base substrate and a plurality of spaced apart end brackets attached to the base substrate. A plurality of spaced apart side panel assemblies each include a printed circuit substrate and are removably mounted between each end bracket. A shroud is pivotally attached to each one of the side panel assemblies. Each shroud is movable about a pivot axis between an open position and a closed position for moving the respective printed circuit substrate from an inserted position to a seated position with the base substrate.

A principal advantage of this embodiment is that fewer components are required to construct the apparatus such that manufacturing cost and assembly time are reduced.

DETAILED DESCRIPTION

Figure 1:
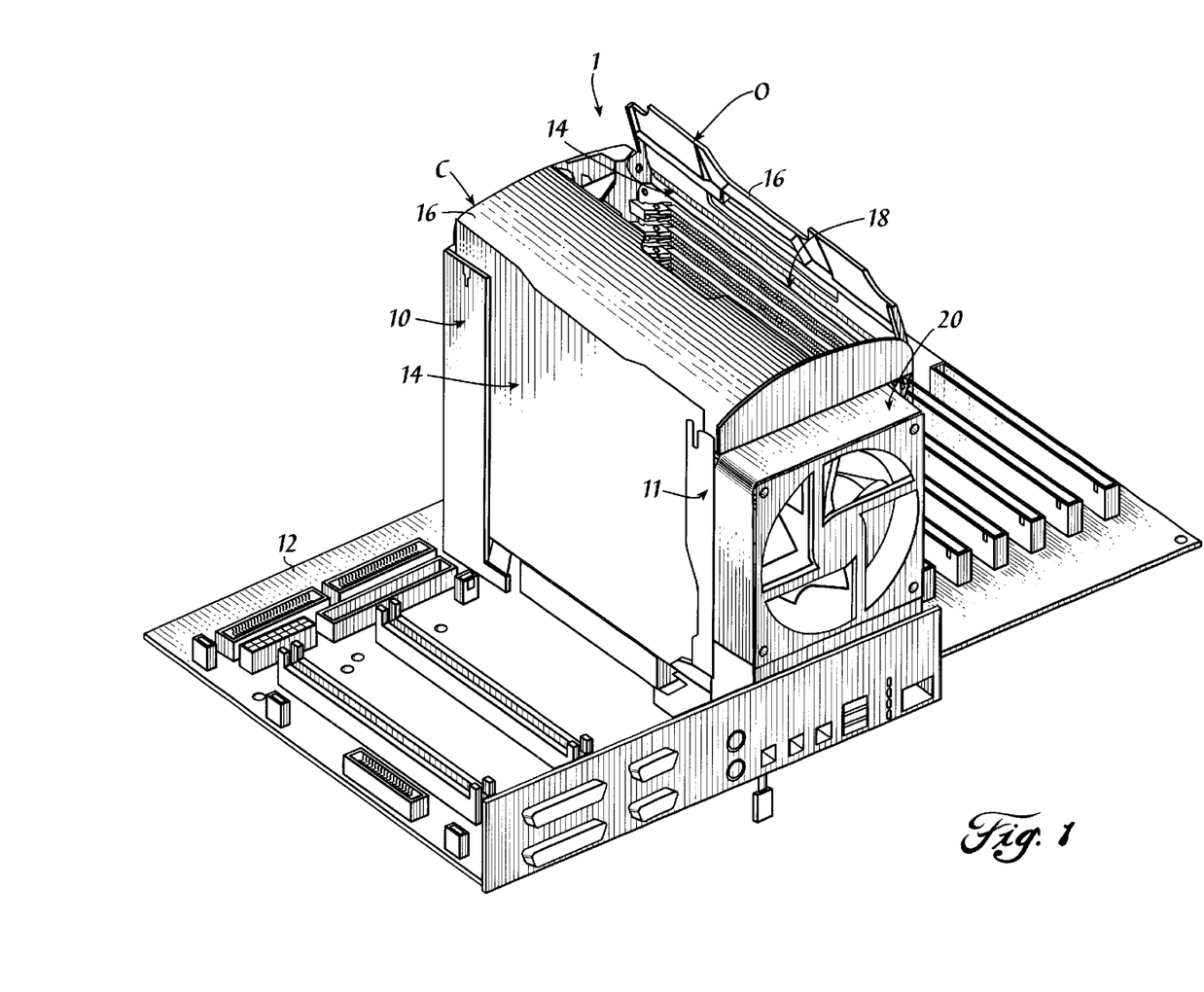
FIG. 1 is a perspective view illustrating an embodiment of an apparatus used for cooling according to the present disclosure.
Figure 2:
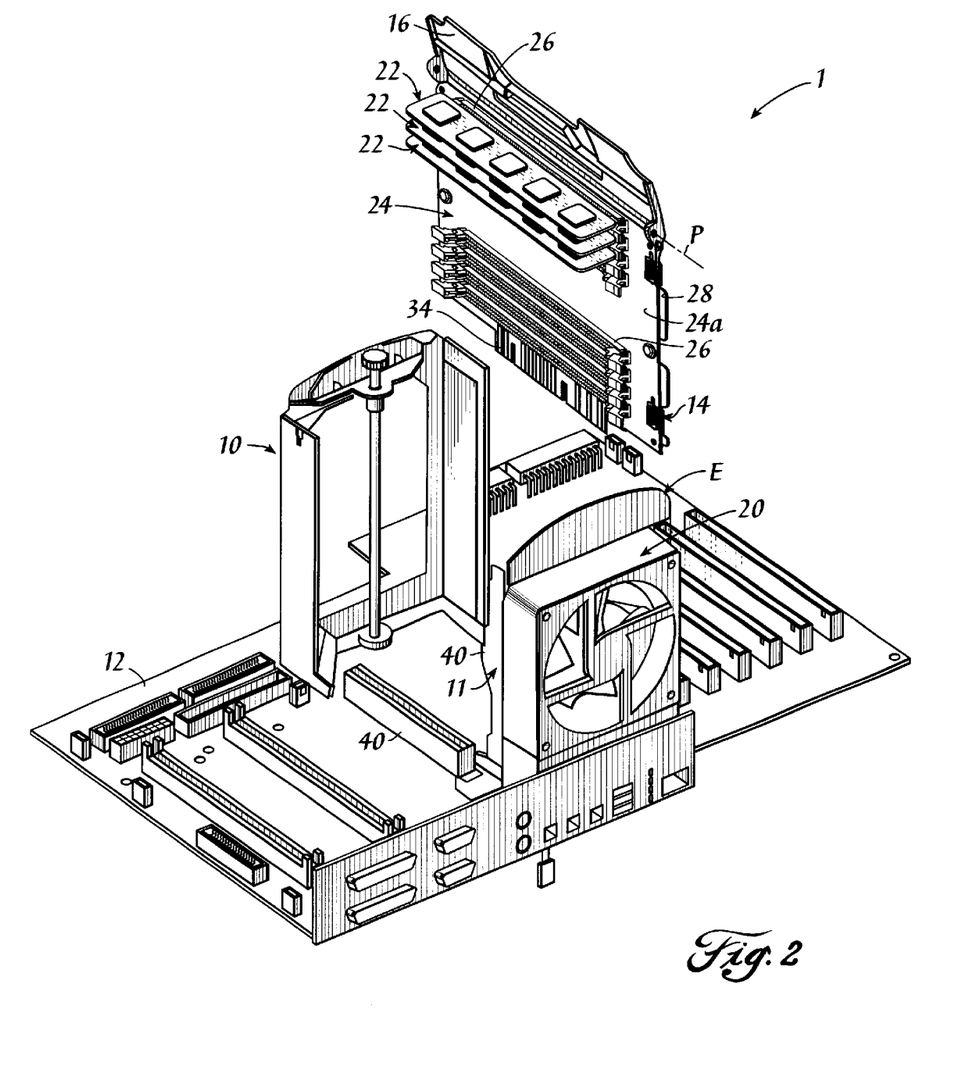
FIG. 2 is a perspective view illustrating the apparatus of FIG. 1 with a plurality of side panel assemblies removed.

An embodiment of an apparatus 1 for cooling a system component of an electronic device and for reducing the magnitude of electromagnetic emissions from the system component is illustrated in FIGS. 1 and 2. The apparatus 1 includes a first end bracket 10 spaced apart from a second end bracket 11. The end brackets 10, 11 are attached to a base substrate 12 such as a motherboard of a computer. Two spaced apart side panel assemblies 14 are removably attached between the end brackets 10, 11.

A shroud member 16 is pivotally attached to each one of the side panel assemblies 14. Each shroud member 16 is movable between an open position O and a closed position C, as illustrated in FIG. 1. When each shroud member 16 is in the closed position C, an air duct 18, FIG. 1, is defined between the base substrate 12, the side panel assemblies 14 and the shrouds 16. The shrouds 16 (when in the closed position C) and the base substrate 12 define opposing side walls of the air duct 18. The end brackets 10, 11 and the shrouds 16 are preferably made of a polymeric material such as Polycarbonate, Acrylonitrile Butadiene Styrene (commonly known as ABS) or a combination thereof using a process such as injection molding.

A plurality of heat generating components 22, FIG. 2, are attached to at least one of the side panel assemblies 14. In one embodiment, the side panel assemblies 14 are system component assemblies including an expansion card or a riser card with at least one heat generating component attached to the expansion card. Heat generating components 22 include system components of an electronic device such as memory modules, microprocessors and video controllers. Each one of the side panel assemblies 14 are oriented between the end brackets 10 and 11 with the heat generating components 22 facing toward the air duct 18. A fan 20 is attached to the second end bracket 11 for directing a stream of air through the air duct 18. In this orientation, the heat generating components 22 are exposed to the stream of air as it passes through the air duct 18 such that the convective transfer of heat from the heat generating components 22 is significantly increased. A key benefit of the shrouds 16 is that each shroud contributes to providing an efficient flow of air through the air duct 18. A key benefit of the fan being attached to the end bracket 11 is reduced acoustical noise associated with the operation of the fan 20. The acoustical noise generated by the fan 20 is reduced by the mechanical attachment of the fan 20 to the end bracket 11 and by the mechanical attachment of the base substrate to an enclosure or chassis of the associated electronic device.

Figure 3:
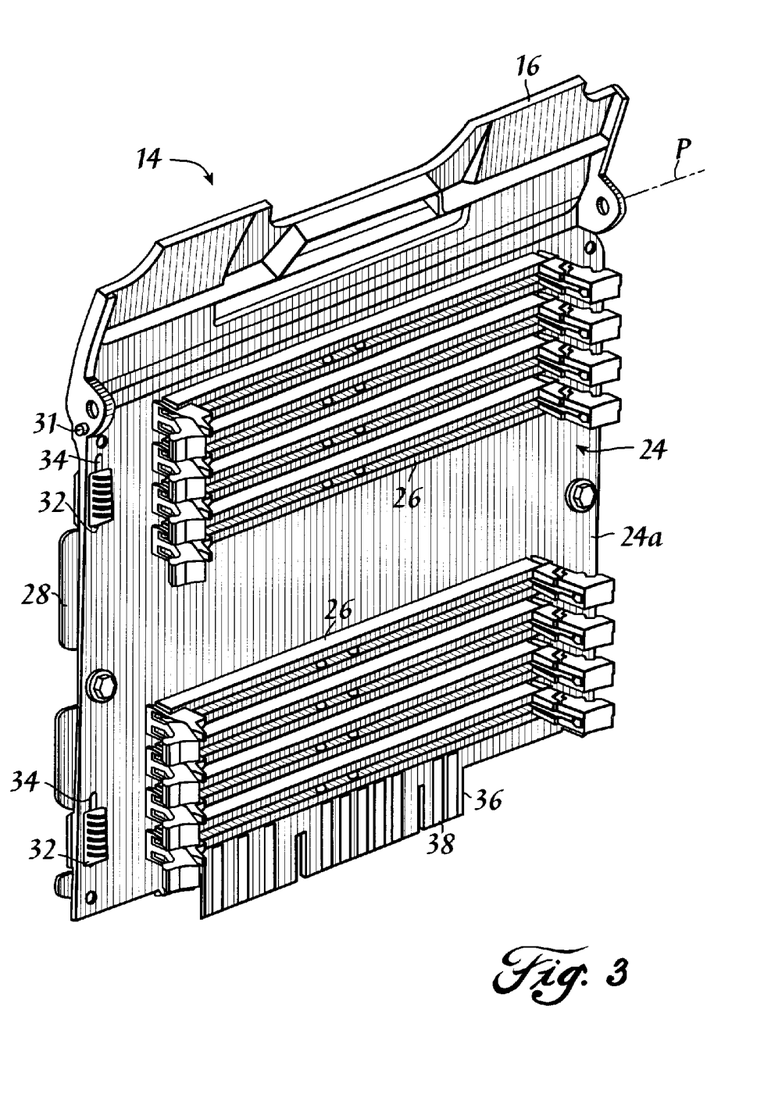
FIG. 3 is a perspective view illustrating an embodiment of a printed circuit substrate portion of the side panel assembly.
Figure 4:
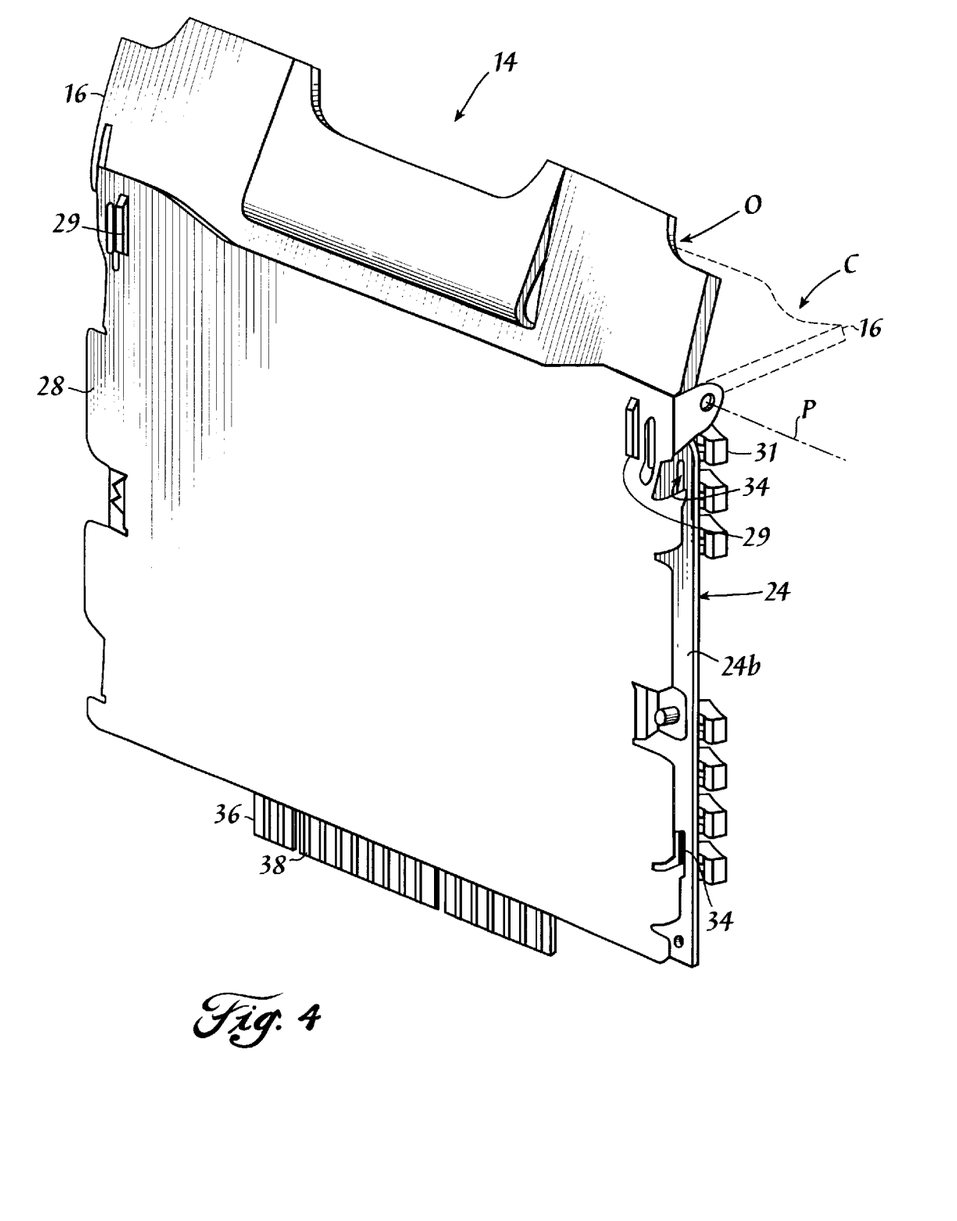
FIG. 4 is a perspective view illustrating an embodiment of a support member portion of the side panel assembly.

Referring now to FIGS. 2–5, the side panel assemblies 14 include a printed circuit substrate 24 having a plurality of connectors 26 attached to the first side 24a, FIGS. 2 and 3, and a support member 28 attached to a second side 24b, FIG. 4. The support member 28 is made of a metallic material such as steel to increase the overall strength of the respective side panel assembly 14. In other embodiments, the support member 28 may be made of a non-conductive material such as a polymeric material. A single size support member 28 can be used with different size printed circuit substrates 24. The support member 28 includes a plurality of alignment members 29. Each one of the end brackets 10, 11 includes an alignment feature, discussed below, that receives a corresponding one of the alignment members 29. The heat generating components 22 are electrically connected to the printed circuit substrate 24 of the corresponding side panel assembly 14.

The shroud 16, FIGS. 3 and 4, is pivotally attached to the support member 28 for being pivoted about a pivot axis P between the open position O and the closed position C, FIG. 4. The shrouds 16 define a shroud assembly extending between the side panel assemblies 14 when both shrouds 16 are in the closed position C. A pivot pin 31 is attached to each end of the shroud 16. Each pivot pin 31 is offset from the pivot axis P such that each pivot pin 31 rotates about the pivot axis P when the shroud 16 is moved between the open position O and closed position C. As discussed below, the pivot pins 31 engage a corresponding portion of the adjacent side panel 10, 11 when the shroud 16 is moved from open position O to the closed position C to positively seat the side panel assembly 14 relative to the base substrate 12.

Figure 5:
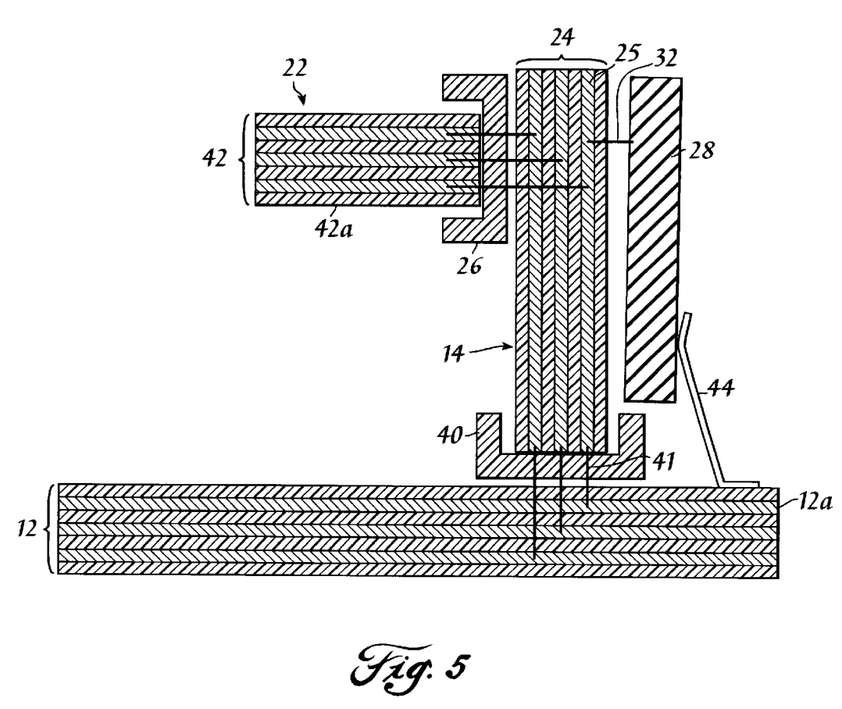
FIG. 5 is a diagrammatic view illustrating an embodiment of the electrical connections between a base substrate, the printed circuit substrate of the side panel assembly and a printed circuit card of a heat generating component.

The printed circuit substrate 24 of the side panel assembly 14 includes at least one reference voltage plane 25, FIG. 5. The support member 28 is electrically connected to the reference voltage plane 25 of the printed circuit substrate 24 by a plurality of clips 32, FIGS. 3 and 5. Each one of the clips 32 are inserted through a corresponding hole 34, FIGS. 3 and 4, in the printed circuit substrate 24. The reference voltage plane 25 is exposed at each hole 34 such that an electrical connection is established between the reference voltage plane 25 and the support member 28.

The printed circuit substrate 24, FIGS. 2–4, also includes an edge portion 36 having a plurality of contacts 38. The contacts 38 are electrically connected to the connectors 26 via conductive traces (not shown) formed on one or more conductive layers of the printed circuit substrate 24. The contacts 38 engage respective terminal (not shown) of a corresponding connector 40, FIG. 2, that is mounted on the base substrate 12. In this manner, electrical continuity is established between the base substrate 12 and heat generating components of the side panel assemblies 14.

As illustrated in FIG. 5, the base substrate 12 includes a reference voltage plane 12a and the heat generating device 22 includes a printed circuit card 42 having a reference voltage plane 42a. A conductive contact member 44 is resiliently mounted to the base substrate 12 adjacent to the connector 26. The conductive contact member 44 is electrically connected to the reference voltage plane 12a of the base substrate 12. When the edge portion 36, FIG. 2, of the side panel assembly 24 is mounted in the connector 40, the conductive contact member 44, FIG. 5, engages the support member 28 to provide electrical continuity between the reference voltage plane 12a of the base substrate 12, the support member 28 and the reference voltage plane 25 of the printed circuit substrate 24. Electrical continuity can also be established between the reference voltage planes 12a and the reference voltage plane 25 through a terminal 41 of the connector 40.

By electrically connecting the support member 28 to the reference voltage planes 12a, 25, 42a of the base substrate 12, the printed circuit substrate 24, and the printed circuit card 42, respectively, a conductive return current path is established for the electrical portion of the electromagnetic emissions. A portion of the electromagnetic emissions couple to the support member 28 and return to their source (the heat generating components). In this manner, the magnitude of the electromagnetic emissions that are emitted from the heat generating components 22 is significantly reduced. It is desirable to reduce the magnitude of the electromagnetic emissions to reduce adverse affects of the electromagnetic emissions (such as electromagnetic interference) on adjacent electronic components and equipment. It is not essential for the reference voltage planes 12a, 25 to be ground planes. They need only be constant voltage planes.

Figure 6A:
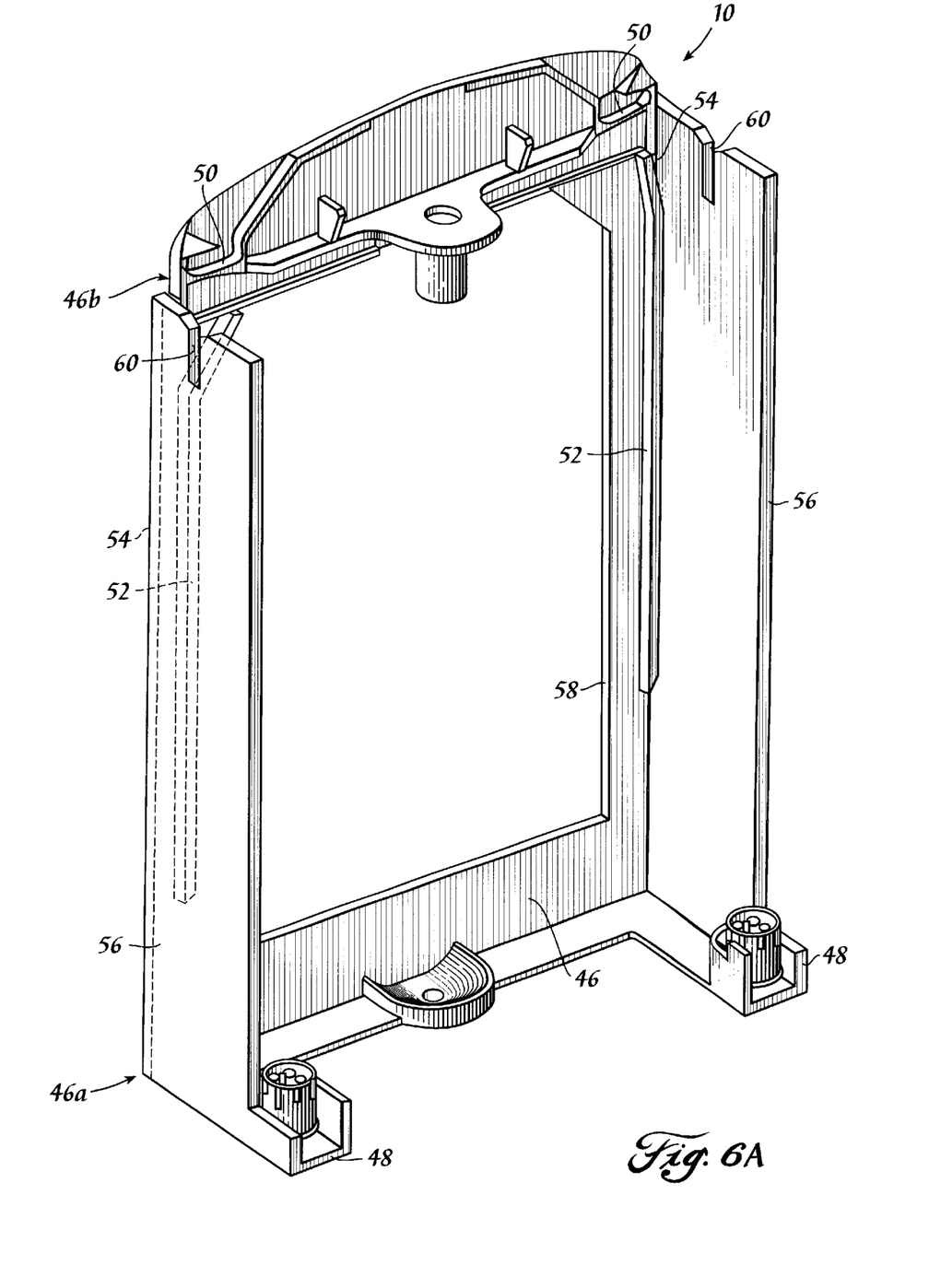
FIG. 6A is a perspective view illustrating an embodiment of an end bracket.
Figure 6B:
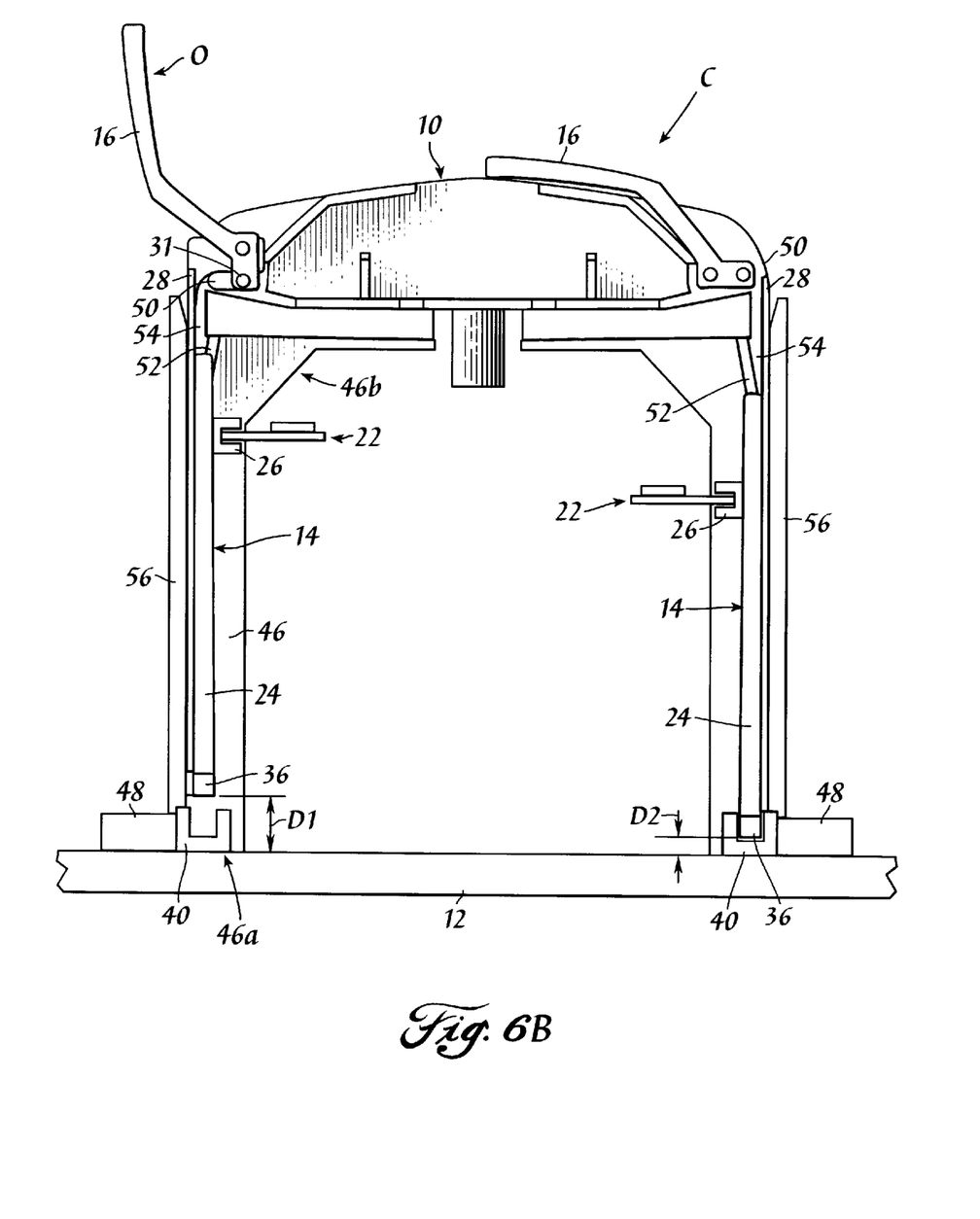
FIG. 6B is a diagrammatic view illustrating a side panel assembly at an inserted depth and side panel assembly at a seated depth with respect to the base substrate.

An embodiment of the first end bracket 10 is illustrated in FIGS. 6A and 6B. The first end bracket 10 includes an end wall 46 and a plurality of mounting members 48 attached adjacent to a first end 46a of the end wall 46. The mounting members 48 are configured for being attached to a base structure such as the base substrate 12 illustrated in FIG. 1. A plurality of shroud engaging portions 50 are attached adjacent to a second end 46b of the end wall 46. A plurality of guide members 52 are attached to the end wall 46. The guide members 52 extend between the first and second ends 46a, 46b of the end wall 46. The first end bracket 10 is defined to be a stationary end bracket in that it is not pivotable with respect to the base substrate 12.

A slot 54, FIG. 6A, for receiving a corresponding one of the side panel assemblies 14 is defined between each guide member 52 and a corresponding side wall 56. A opening 58 is formed through the end wall 46 between two of the guide members 52. A slot 60, is provided in each side wall 56 for receiving the alignment member 29, FIG. 4, of the corresponding side panel assembly 14.

As illustrated in FIG. 6B, when the shroud 16 is in the open position O, the side panel assembly 14 may be inserted to an insertion position D1 with respect to the base substrate 12. When shroud 16 is moved to the closed position C, the pin 31 of each shroud 16 engages the corresponding shroud engaging portion 50 of the first end bracket 10, moving the side panel assembly 14 to a seated position D2 with respect to the base substrate 12 such that the edge portion 36 of the printed circuit substrate 24 engages the corresponding connector 40 of the base substrate 12.

Figure 7:
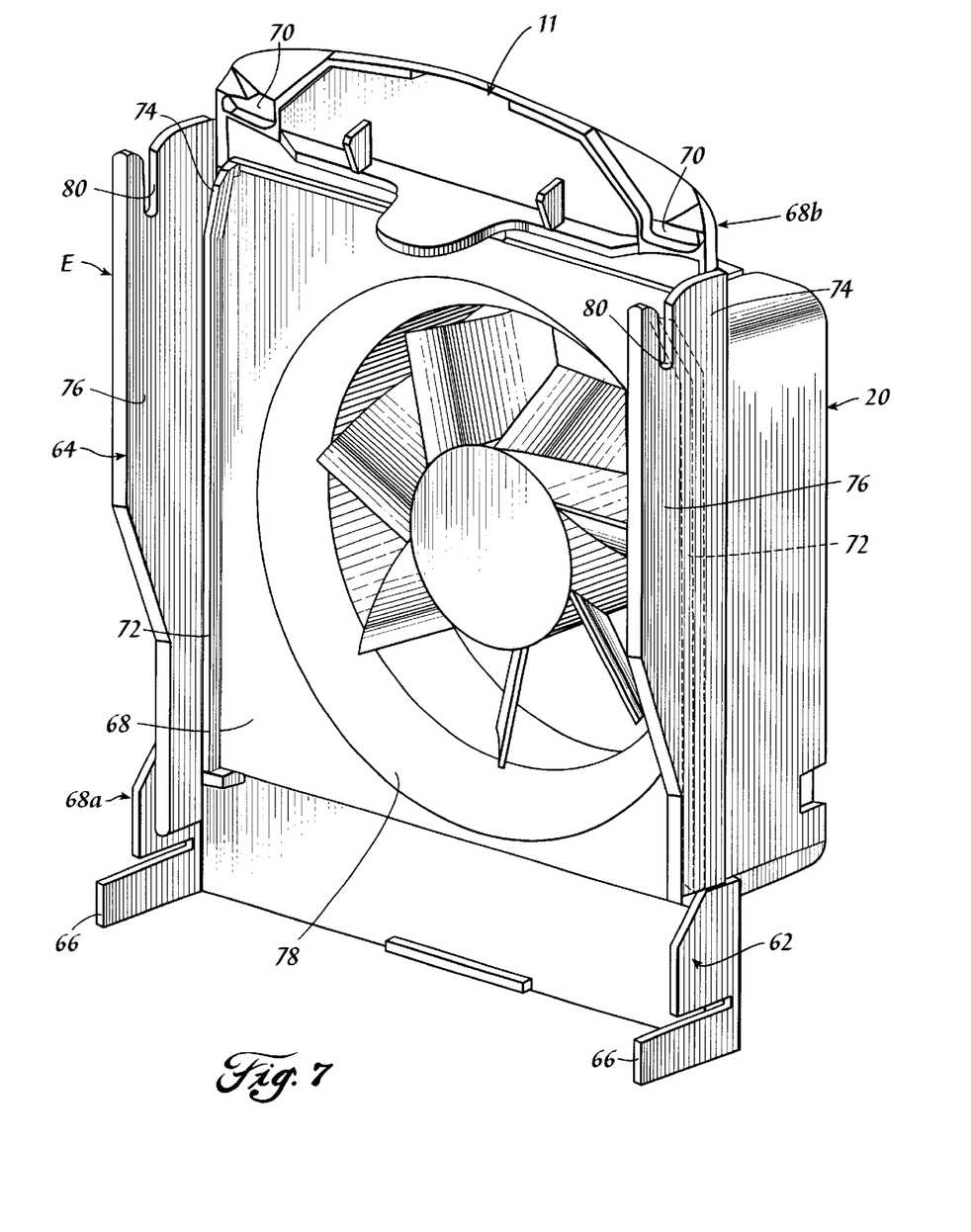
FIG. 7 is a perspective view illustrating another embodiment of an end bracket.
Figure 8:
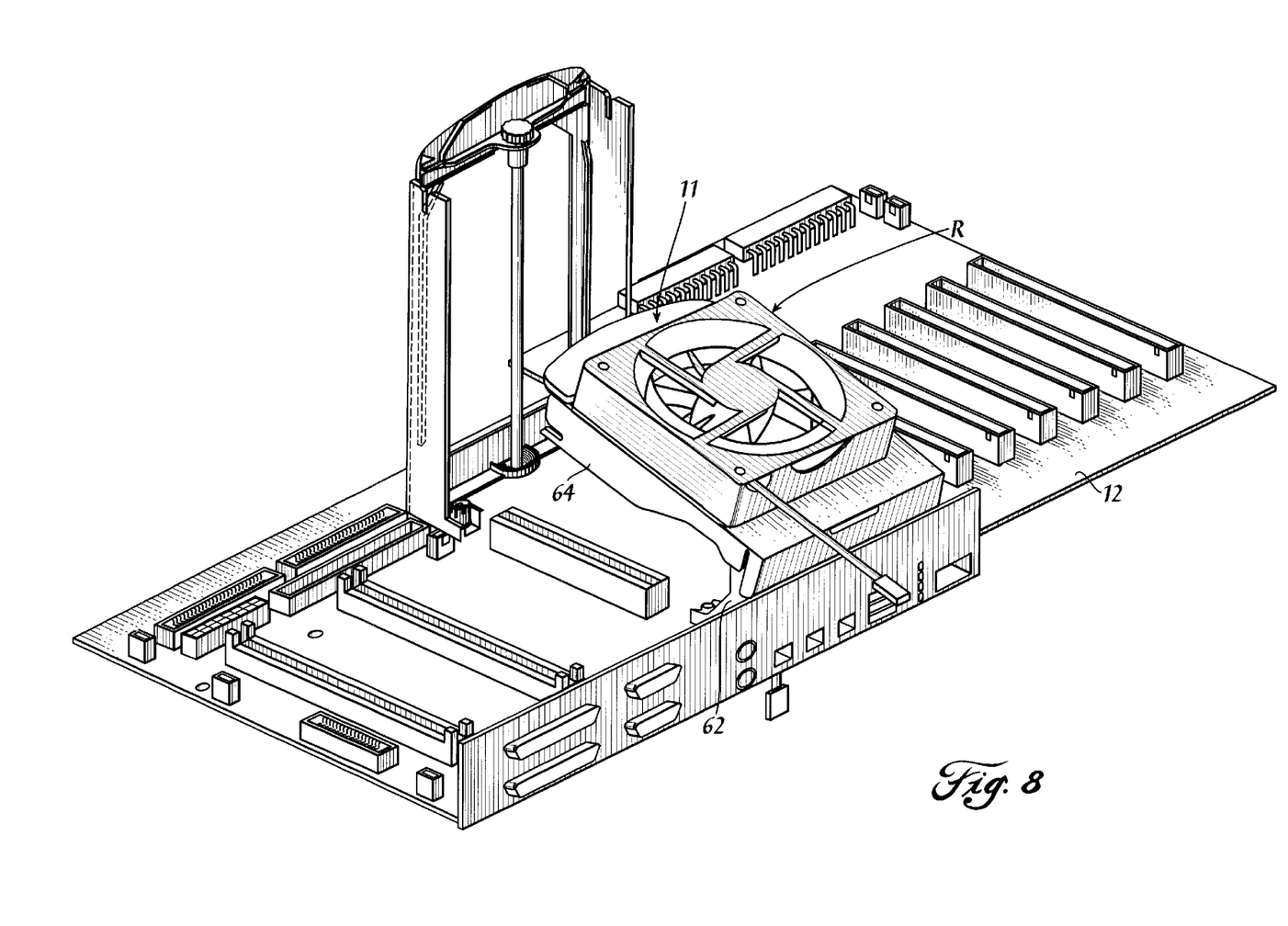
FIG. 8 is a perspective view illustrating the end bracket of FIG. 7 in a retracted position.

An embodiment of the second end bracket 11 is illustrated in FIGS. 7 and 8. The second end bracket 11 includes a base portion 62 and a mounting portion 64. The base portion 62 of the second end bracket 11 includes a plurality of mounting members 66 configured for being attached to a base structure such as the base substrate 12 illustrated in FIG. 8. The mounting portion 64 of the second end bracket 11 is pivotally attached at a first end 68a of an end wall 68 to the base portion 62 for being moved between an extended position E, FIGS. 2 and 7, and a retracted position R, FIG. 8, with respect to the base portion 62. It is desirable for the mounting portion 62 to be movable to the retracted position R to simplify installation of the base substrate 12 into a housing of an electronic apparatus (such as a computer) with second end bracket 11 already attached to the base substrate 12. Furthermore, servicing of components adjacent to the second end bracket 11 is simplified by removing the side panel assemblies 14 and moving the second end bracket 11 to the retracted position R. The second end bracket 11 is defined to be a pivotable end bracket in that it is pivotable with respect to the base substrate 12. Several benefits are associated with the second end bracket 11 being pivotable.

A plurality of shroud engaging portions 70, FIG. 7, are attached adjacent to a second end 68b of the end wall 68. A plurality of guide members 72 are attached to the end wall 68. The guide members 72 extend between the first and second ends 68a, 68b of the end wall 68. A slot 74 for receiving a corresponding one of the side panel assemblies 14 is defined between each guide member 72 and a corresponding side wall 76. A opening 78 is formed through the end wall 68 between two of the guide members 72. The fan 20, discussed above in reference to FIGS. 1 and 2, is attached to the mounting portion 64 adjacent to the opening 78 for directing a stream of air through that opening. A slot 80 is provided in each side wall 76 for receiving the alignment member 29, FIG. 4, of the corresponding side panel assembly 14.

Figure 9:
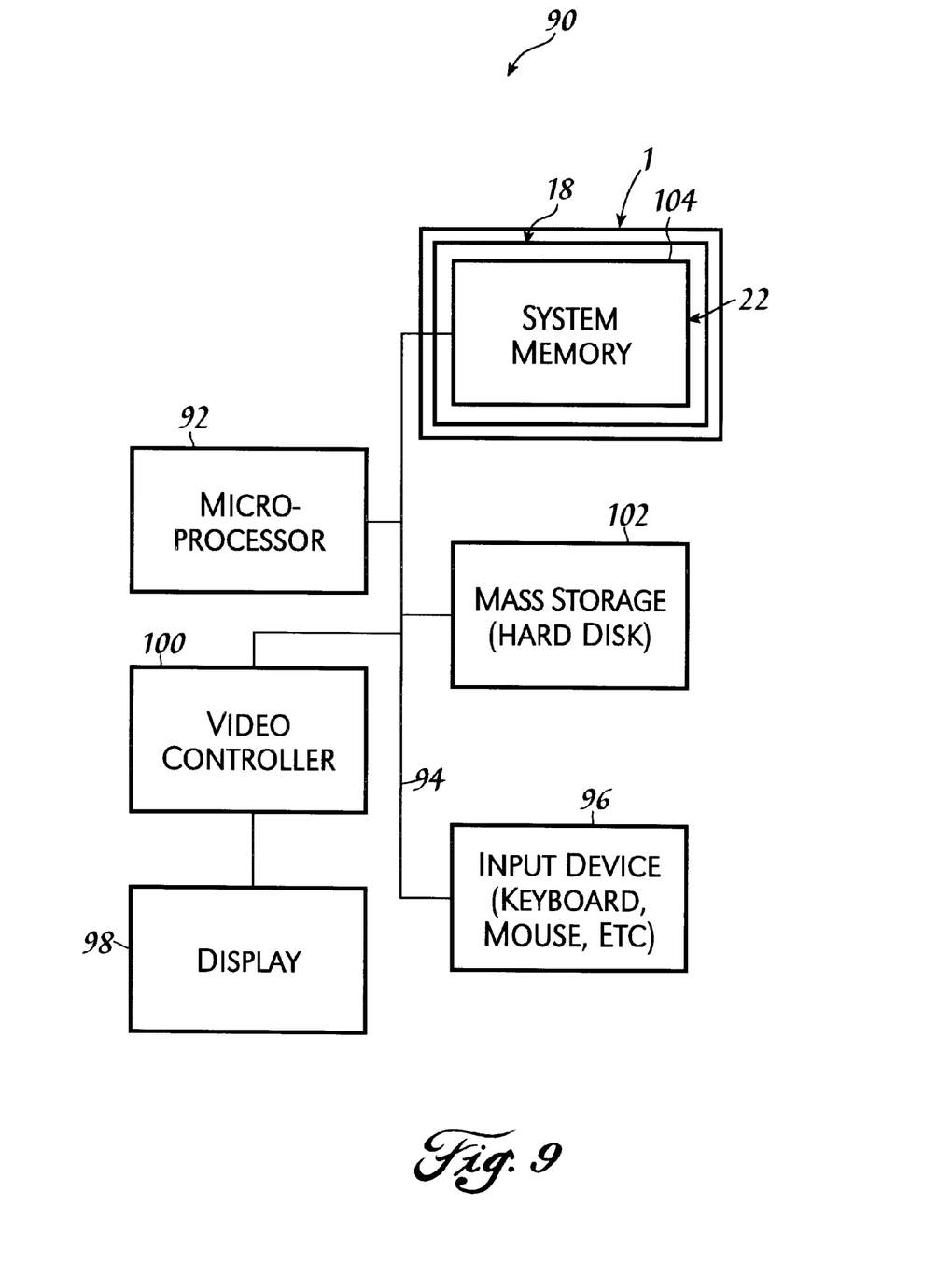
FIG. 9 is a block diagram illustrating an embodiment of a computer system.

An embodiment of a computer system 90 is illustrated in FIG. 9. The computer system 90 includes at least one microprocessor 92. The microprocessor 92 is connected to a signal bus 94. The signal bus 94 serves as a connection between the microprocessor 92 and other components of the computer system 90. One or more input devices 96 may be coupled to the microprocessor 92 to provide input to the microprocessor 92. Examples of input devices include keyboards, touchscreens, and pointing devices such as a mouse, a trackball and a trackpad. The computer system 90 may also include a display 98 which is typically coupled to the microprocessor 92 by a video controller 100. Programs and data are stored on a mass storage device 102 which is coupled to the microprocessor 92. Mass storage devices include components such as hard disks, optical disks, magneto-optical drives, floppy drives, and the like. A system memory 104 is coupled to the microprocessor 92 for providing the microprocessor 92 with fast storage to facilitate execution of computer programs by the microprocessor 92. The system memory 104, which includes the heat generating component 22 of the computer system 90, is mounted within the air duct 18 of the apparatus 1 discussed above in reference to FIG. 1. It should be understood that other busses and intermediate circuits can be employed between the components described above and microprocessor 92 to facilitate interconnection between the components and the microprocessor 92.

One embodiment provides an apparatus for mounting system components in an electronic device including a base substrate and a plurality of spaced apart end brackets attached to the base substrate. A plurality of spaced apart side panel assemblies each including a printed circuit substrate are removably mounted between a mounting portion of each end bracket. A first edge of each side panel assembly is positioned adjacent to the base substrate. A shroud is pivotally attached to each one of the side panel assemblies adjacent to a second edge of the respective side panel assembly. Each shroud is movable about a pivot axis between an open position and a closed position. A shroud engaging portion is attached to each end bracket. An engagement member of each shroud engages a corresponding shroud engaging portion when the respective shroud is moved from the open position to the closed position for moving the respective printed circuit substrate from an inserted position to a seated position with the base substrate.

Another embodiment provides an electronic device enclosure including a base, a pair of opposed end brackets mounted on the base, and a pair of opposed side panel assemblies mounted on the base and connected to the end brackets. Each side panel includes a printed circuit substrate. A plurality of connectors are attached to a first side of the printed circuit substrate. A support member is attached to a second side of the printed circuit substrate. A shroud is pivotally attached to each one of the side panel assemblies. The shroud is movable about a pivot axis between an open position and a closed position. An engagement member is attached to the shroud at a position offset from the pivot axis of the shroud.

A further embodiment provides a computer system including a base substrate having a microprocessor mounted thereon. An input is coupled to the microprocessor, a display is coupled to the microprocessor by a video controller and a mass storage is also coupled to the microprocessor. A plurality of spaced apart end brackets are attached to the base substrate. A plurality of spaced apart side panel assemblies, each including a printed circuit substrate, are removably mounted between a mounting portion of each end bracket. A first edge of each side panel assembly is positioned adjacent to the base substrate. A shroud is pivotally attached to each one of the side panel assemblies. Each shroud is movable about a pivot axis between open and closed positions for moving the respective printed circuit substrate from an inserted position to a seated position with the base substrate. An air duct is defined by the shrouds, the base substrate and the side panel assemblies when the shrouds are in the closed position. A memory module is removably mounted in the air duct on one of the side panels. The memory module is coupled to the microprocessor to provide storage to facilitate execution of computer programs by the microprocessor.

In another embodiment, an electronic device enclosure includes a base substrate and a plurality of spaced apart end brackets attached to the base substrate. A plurality of spaced apart side panel assemblies are removably mounted between each end bracket. Each side panel includes a printed circuit substrate. A shroud is pivotally attached to each one of the side panel assemblies. Each shroud is movable about a pivot axis between open and closed positions for moving the respective printed circuit substrate from an inserted position to a seated position with the base substrate.

As it can be seen, the embodiments presented herein provide several advantages. Fewer components are required to construct the apparatus relative to previous apparatuses, reducing the cost and assembly time. The shrouds function as a cam device for seating the system component assembly in the chassis. No screws are needed to secure the system component assembly in place, thus reducing assembly and service times. The shrouds assist in directing air through the system component subassembly for enhancing airflow over the system component assemblies. The shrouds function as a handle for providing an easy access point to install and remove the system component assemblies. The shroud of a side panel assembly also serves as a handle for carrying the side panel assembly when it is removed from the apparatus.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An apparatus for mounting system components in an electronic device, comprising:
    a base substrate;
    a plurality of spaced apart end brackets attached to the base substrate;
    a plurality of spaced apart side panel assemblies each including a printed circuit substrate and being removably mounted between a mounting portion of each end bracket, a first edge of each side panel assembly positioned adjacent to the base substrate;
    a shroud pivotally attached to each one of the side panel assemblies adjacent to a second edge of the respective side panel assembly, each shroud being movable about a pivot axis between an open position and a closed position;
    a shroud engaging portion attached to each end bracket; and
    an engagement member of each shroud engaging a corresponding shroud engaging portion when the respective shroud is moved from the open position to the closed position for moving the respective printed circuit substrate from an inserted position to a seated position with the base substrate.

2. The apparatus of claim 1 wherein the engagement member is a pin attached at a position offset from the pivot axis of the respective shroud.

3. The apparatus of claim 1 wherein the side panel assemblies, the base substrate and the shrouds define an air duct therebetween when the shrouds are in the closed position and further comprising a fan mounted adjacent to attached to at least one of the end brackets for directing air through the air duct.

4. The apparatus of claim 3 further comprising a system component attached to a first side of each printed circuit substrate.

5. The apparatus of claim 4 wherein the first side of each printed circuit substrate defines an interior surface of the air duct.

6. The apparatus of claim 5 wherein each printed circuit substrate includes an edge portion and a plurality of contacts mounted on the edge portion, the contacts being electrically connected to the system component of the respective printed circuit substrate and further comprising an electrical connector attached to the base substrate adjacent to each edge portion, the edge portion of each printed circuit substrate engaged with the corresponding connector when the respective side panel assembly is in the seated position.

7. The apparatus of claim 5 wherein each side panel assembly extends in a direction generally perpendicular to the base substrate and each system component extends in a direction generally parallel to the base substrate.

8. The apparatus of claim 5 wherein the printed circuit substrate includes a support member attached to a second side thereof.

9. The apparatus of claim 8 wherein the base substrate is a motherboard.

10. The apparatus of claim 9 wherein the support member is made from an electrically conductive material.

11. The apparatus of claim 10 wherein the motherboard includes a reference voltage plane and wherein the support member of each side panel assembly is electrically connected to the reference voltage plane when the respective side panel assembly is in the seated position.

12. The apparatus of claim 1 further comprising an alignment member attached to each side panel assembly and further comprising a slot in each end bracket adjacent to each side panel, the alignment member engaged with the corresponding slot when the respective side panel assembly is in the seated position.

13. An electronic device enclosure comprising:

a base;

a pair of opposed end brackets mounted on the base; and a pair of opposed side panel assemblies mounted on the base and connected to the end brackets, each side panel comprising:
 a printed circuit substrate;
 a plurality of connectors attached to a first side of the printed circuit substrate;
 a support member attached to a second side of the printed circuit substrate;
 a shroud pivotally attached to each one of the side panel assemblies, the shroud being movable about a pivot axis between an open position and a closed position; and
 an engagement member attached to the shroud at a position offset from the pivot axis of the shroud.

14. The enclosure of claim 13 wherein each printed circuit substrate includes an edge portion and a plurality of contacts mounted on the edge portion.

15. The enclosure of claim 14 further comprising a system component attached to the first side of the printed circuit substrate.

16. The enclosure of claim 15 wherein the support member is made from an electrically conductive material.

17. The enclosure of claim 16 wherein the support member is electrically connected to a reference voltage plane of the printed circuit substrate.

18. A computer system, comprising:

a base substrate;

a microprocessor mounted on the base substrate;

an input coupled to the microprocessor to provide input to the microprocessor;

a display coupled to the microprocessor by a video controller;

a mass storage coupled to the microprocessor;

a plurality of spaced apart end brackets attached to the base substrate, a plurality of spaced apart side panel assemblies each including a printed circuit substrate and being removably mounted between a mounting portion of each end bracket, a first edge of each side panel assembly positioned adjacent to the base substrate;

a shroud pivotally attached to each one of the side panel assemblies adjacent to a second edge of the respective side panel assembly, each shroud being movable about a pivot axis between an open position and a closed position;

a shroud engaging portion attached to each end bracket;

an engagement member of each shroud engaging a corresponding shroud engaging portion when the respective shroud is moved from the open position to the closed position for moving the respective printed circuit substrate from an inserted position to a seated position with the base substrate, the shrouds, the base substrate and the side panel assemblies defining an air duct when the shrouds are in the closed position; and a memory module removably mounted in the air duct on one of the side panel assemblies, the memory module being coupled to the microprocessor to provide storage to facilitate execution of computer programs by the microprocessor.

19. An electronic device enclosure comprising:

a base substrate;

a plurality of spaced apart end brackets attached to the base substrate;

a plurality of spaced apart side panel assemblies each including a printed circuit substrate and being removably mounted between each end bracket; and a shroud pivotally attached to each one of the side panel assemblies, each shroud being movable about a pivot axis between an open position and a closed position for moving the respective printed circuit substrate from an inserted position to a seated position with the base substrate.

20. The enclosure of claim 19 wherein each printed circuit substrate includes an edge portion and a plurality of contacts mounted on the edge portion.

* * * * *